(12) United States Patent
Aluthwala et al.

(10) Patent No.: US 12,494,796 B2
(45) Date of Patent: Dec. 9, 2025

(54) CIRCUIT AND METHOD FOR OPERATING AN ANALOG-TO-DIGITAL CONVERTER IN MULTIPLE MODES USING RING OSCILLATORS

(71) Applicant: Avago Technologies International Sales Pte. Limited, Singapore (SG)

(72) Inventors: Pasindu Aluthwala, Seven Hills (AU); Andrew Adams, Sydney (AU)

(73) Assignee: Avago Technologies International Sales Pte. Limited, Singapore (SG)

( * ) Notice: Subject to any disclaimer, the term of this patent is extended or adjusted under 35 U.S.C. 154(b) by 279 days.

(21) Appl. No.: 18/308,796

(22) Filed: Apr. 28, 2023

(65) Prior Publication Data

US 2024/0364355 A1    Oct. 31, 2024

(51) Int. Cl.
  *H03M 1/12*    (2006.01)

(52) U.S. Cl.
  CPC ................... *H03M 1/1245* (2013.01)

(58) Field of Classification Search
  CPC .................................... H03M 1/1245
  USPC ........................................ 341/155
  See application file for complete search history.

(56) References Cited

U.S. PATENT DOCUMENTS

| | | | | |
|---|---|---|---|---|
| 5,475,344 | A * | 12/1995 | Maneatis | H03K 3/03 331/25 |
| 6,281,831 | B1 * | 8/2001 | Shou | H03M 1/42 341/172 |
| 9,768,799 | B1 * | 9/2017 | Yoo | H03K 19/21 |
| 2006/0001496 | A1 * | 1/2006 | Abrosimov | H03K 3/0322 331/57 |
| 2009/0261911 | A1 * | 10/2009 | Watanabe | H03B 27/00 331/57 |
| 2010/0176889 | A1 * | 7/2010 | Nix | H03K 3/0315 331/57 |

(Continued)

FOREIGN PATENT DOCUMENTS

| | | |
|---|---|---|
| EP | 2 312 753 A1 | 4/2011 |
| WO | WO-2021/004635 A1 | 1/2021 |

OTHER PUBLICATIONS

Ahmed Ibrahim et al: "A Probabilistic Compute Fabric Based on Coupled Ring Oscillators for Solving Combinatorial Optimization Problems", IEEE Journal of Solid-State Circuits, IEEE, USA, vol. 56, No. 9, Mar. 12, 2021 (Mar. 12, 2021), pp. 2870-2880, XP011874268, ISSN: 0018-9200, DOI: 10.1109/JSSC.2021.3062821 [retrieved on Aug. 25, 2021] abstract * Section III.A * Section III.B * figures 4,5,9,10,13 *.

(Continued)

*Primary Examiner* — Peguy Jean Pierre
(74) *Attorney, Agent, or Firm* — Foley & Lardner LLP

(57) ABSTRACT

A device may include one or more ring oscillators and circuitry. The one or more ring oscillators may include a plurality of rings. The circuitry may be configured to receive a selection of a number of coupled rings and a number of phases. The circuitry may be configured to configure the one or more ring oscillators to operate at least based on the number of coupled rings. The circuitry may be configured to cause the configured one or more ring oscillators to receive an input signal and output a plurality of signals having respective phases corresponding to the number of phases. The circuitry may be configured to convert the plurality of signals to one or more digital signals.

20 Claims, 9 Drawing Sheets

(56) References Cited

U.S. PATENT DOCUMENTS

| | | | |
|---|---|---|---|
| 2011/0267148 A1 | 11/2011 | Bagheri et al. | |
| 2013/0268978 A1 | 10/2013 | Trerise et al. | |
| 2014/0049328 A1* | 2/2014 | Smith | H03K 3/0322 |
| | | | 331/57 |
| 2019/0165769 A1* | 5/2019 | Tsai | H03L 7/087 |
| 2023/0268927 A1* | 8/2023 | Becker | H03M 1/0617 |
| 2024/0063778 A1* | 2/2024 | Shen | H03K 3/0315 |

OTHER PUBLICATIONS

Foreign Search Report on non-Foley case related to U.S. Appl. No. 18/308,796 DTD Oct. 11, 2024.

Maneatis JG et al: "Precise Delay Generation Using Coupled Oscillators", IEEE Journal of Solid-State Circuits, IEEE, USA, vol. 28, No. 12, Dec. 1993 (Dec. 1993), pp. 1273-1282, XP000435900, ISSN: 0018-9200, DOI: 10.1109/4.262000 Section III.D * Section IV * Section V * figures 3,5,6,7,8,10,14.

Matthias Ihmig et al: "Flexible multi-standard multi-channel system architecture for Software Defined Radio receiver", Intelligent Transport Systems Telecommunications, (ITST),2009 9th International Conference on, IEEE, Piscataway, NJ, USA, Oct. 20, 2009 (Oct. 20, 2009), pp. 598-603, XP031619118,ISBN: 978-1-4244-5346-7 * Section IV.A; figure 2 *.

Mohammed M Abdul-Latif et al: "Low Phase 1 Noise Wide Tuning Range N-Push Cyclic-Coupled Ring Oscillators", IEEE Journal of Solid-State Circuits, IEEE, USA, vol. 47, No. 6, Jun. 2012 (Jun. 2012), pp. 1278-1294, XP011444797, ISSN: 0018-9200, DOI: 10.1109/JSSC.2012.2188564 Title * Section II.A * Section II.B.1 * Section III * Section III.B.1 * Section III.B.2 * Section IV * figures 10,14,16,17,21{a).

* cited by examiner

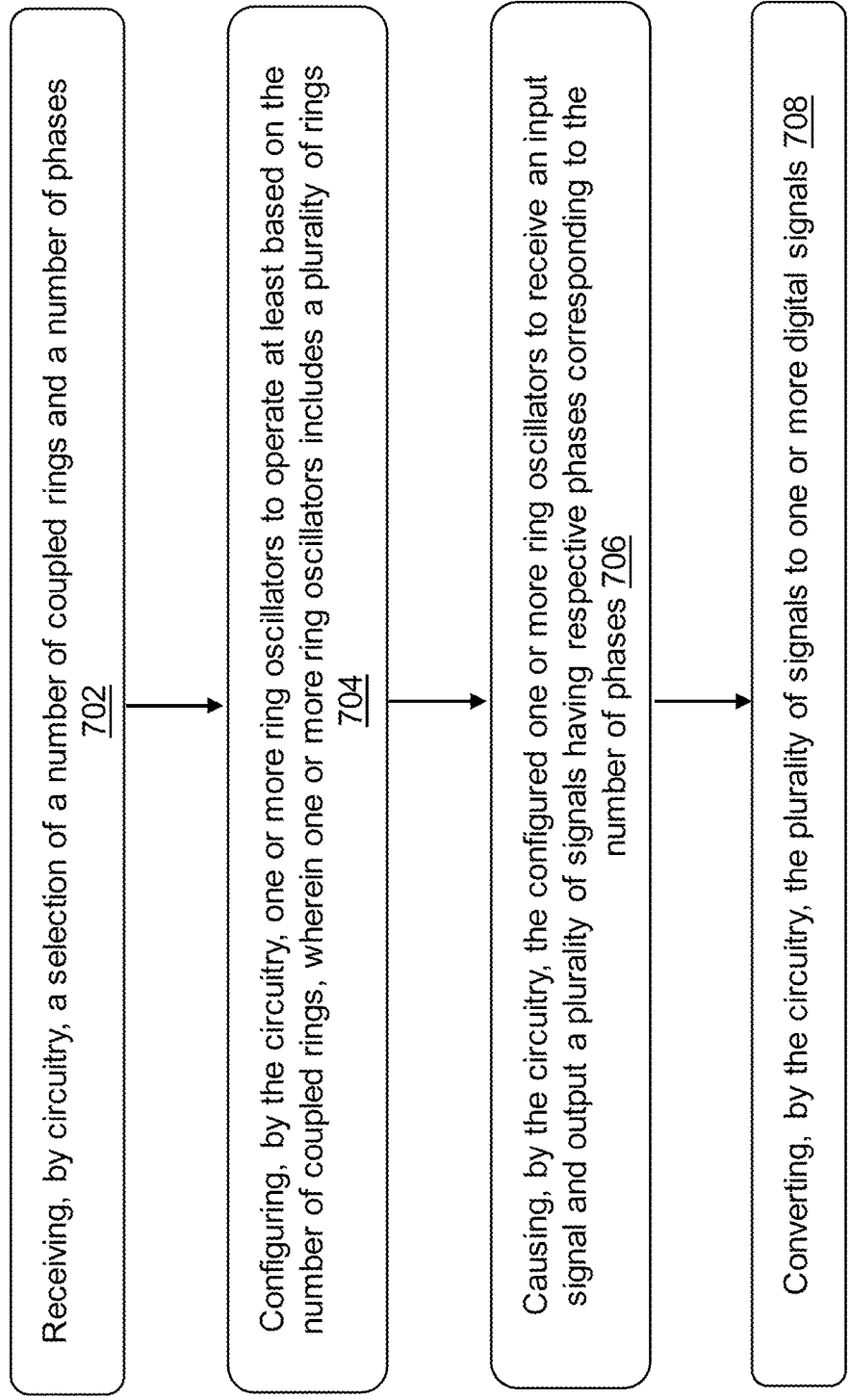

CIRCUIT AND METHOD FOR OPERATING AN ANALOG-TO-DIGITAL CONVERTER IN MULTIPLE MODES USING RING OSCILLATORS

FIELD OF THE DISCLOSURE

This disclosure generally relates to systems and methods for analog-to-digital conversion, and more particularly to operating an analog-to-digital converter (ADC) in multiple modes using ring oscillators.

BACKGROUND

In a ring oscillator-based ADC (e.g., voltage-controlled ring oscillator (VCRO)-based ADC), the phase noise of the VCRO may be a major contributor to the noise floor of the ADC (e.g., the amount of noise generated by the ADC). Moreover, the power consumption of an ADC may not scale with bandwidths, thereby causing the chip power consumption to be relatively high even in the lowest bandwidth.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 7 is a flow diagram showing a process for operating an ADC in multiple modes using one or more ring oscillators, in accordance with an embodiment.

Figure 1:
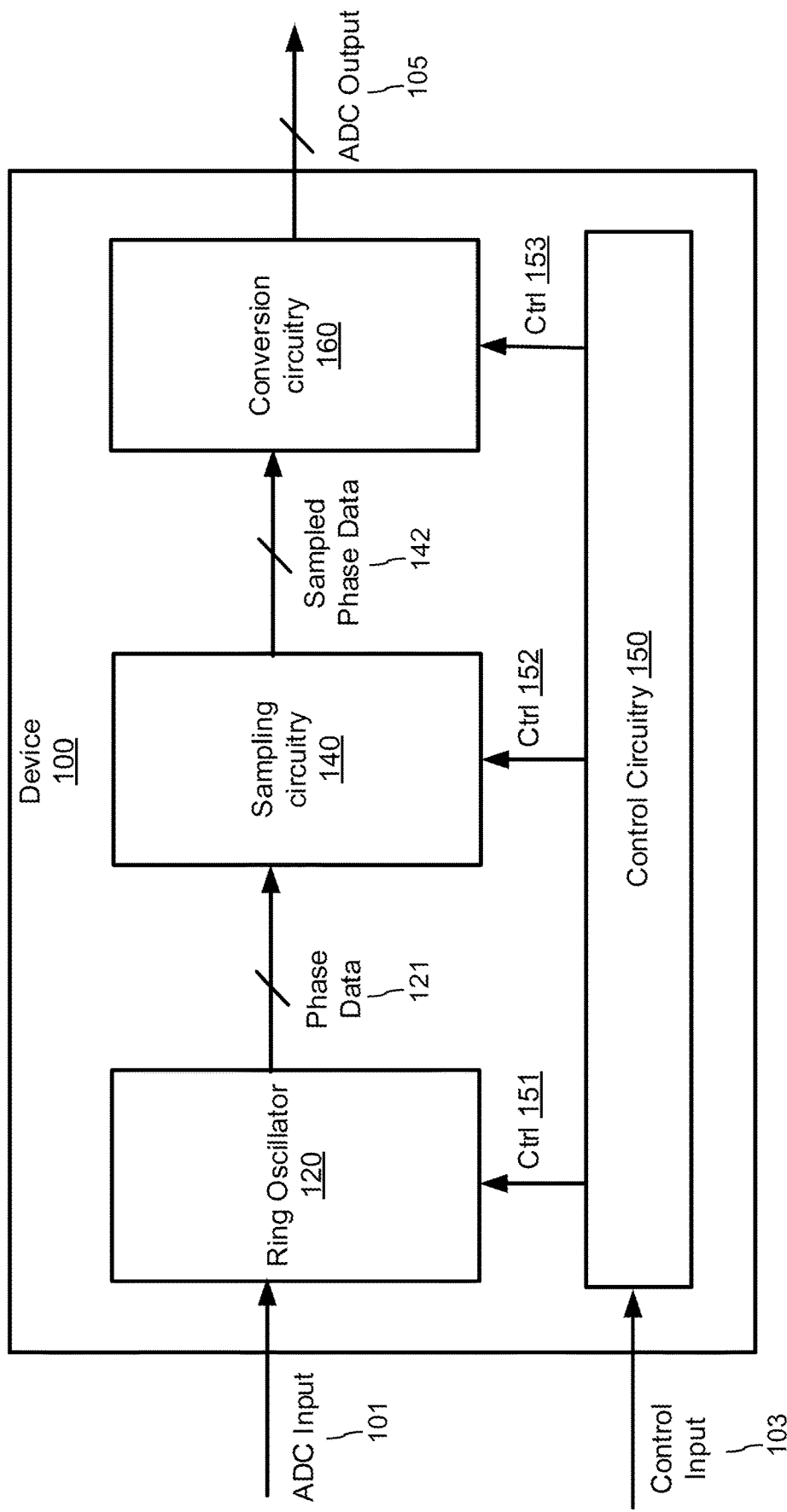
FIG. 1 is a schematic block diagram of a device for operating an analog-to-digital converter (ADC) in multiple modes, in accordance with an embodiment.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a device including one or more ring oscillators and circuitry. In some embodiments, a ring oscillator is a device or circuitry whose output oscillates between two voltage levels using a plurality of buffers, delay stages, inverters (e.g., NOT gates), or amplifiers connected in a ring according to some embodiments. For example, a ring oscillator may include an odd number of NOT gates or inverters connected in a ring. In some embodiments, a ring oscillator may include (1) an odd number of NOT gates or inverters and (2) one or more other non-inverting buffers/delay stages/amplifiers. In some embodiments, a ring oscillator may include one or more rings or a plurality of rings in each of which a plurality of buffers, delay stages, inverters, or amplifiers are connected. The circuitry may be configured to receive a selection of a number of coupled rings and a number of phases. Coupled rings refers to a plurality of rings (in a ring oscillator) coupled to one another such that at least one buffer, delay stage, inverter or amplifier of one ring is coupled to at least one buffer, delay stage, inverter or amplifier of another ring, according to some embodiments. The circuitry may be configured to configure the one or more ring oscillators to operate at least based on the number of coupled rings. The circuitry may be configured to cause the configured one or more ring oscillators to receive an input signal and output a plurality of signals having respective phases corresponding to the number of phases. The circuitry may be configured to convert the plurality of signals to one or more digital signals.

In some embodiments, the circuitry may be configured to receive a selection of a sampling frequency. The circuitry may be configured to convert the plurality of signals to the one or more digital signals at least based on the sampling frequency.

In some embodiments, the number of coupled rings may be an integer L that is less than or equal to an integer N. The one or more ring oscillators may include a multi-ring oscillator having N rings that are coupled to each other. In configuring the one or more ring oscillators, the circuitry may be configured to configure the multi-ring oscillator to operate with L coupled rings out of the N coupled rings, as the configured one or more ring oscillators.

In some embodiments, the number of coupled rings may be an integer L that is less than or equal to an integer N. The one or more ring oscillators may include N ring oscillators, each having a different number of coupled rings to each other. In configuring the one or more ring oscillators, the circuitry may be configured to select a ring oscillator having L coupled rings, from among the N ring oscillators, as the configured one or more ring oscillators.

In some embodiments, the circuitry may include a plurality of circuits respectively configured to perform a plurality of modes of analog digital converter (ADC) operations. Modes of ADC operations refer to different configurations of a plurality of components of an ADC (e.g., ring oscillator, sampling circuitry, phase decoder, differentiator, decimator, or other components), or other configuration that may produce different power consumption characteristics of the ADC (e.g., power consumption with respect to bandwidths, dynamic ranges, phase noise, quantization noise, etc.). The circuitry may be configured to select one or more circuits from among the plurality of circuits. The circuitry may be configured to cause the selected one or more circuits to convert the plurality of signals to the one or more digital signals.

Various embodiments disclosed herein are related to an analog digital converter including an input to receive an analog signal, one or more ring oscillators, and circuitry. In some embodiments, the one or more ring oscillators may include a plurality of rings. The one or more ring oscillators may be configurable to operate at least based on a programmable number of coupled rings of the plurality of rings. The circuitry may be coupled to the one or more ring oscillators. The circuitry may be programmable to receive a selection of a number of coupled rings and a number of phases. The circuitry may be programmable to configure the one or more ring oscillators to operate at least based on the number of coupled rings. The circuitry may be programmable to cause the configured one or more ring oscillators to receive the analog signal and output a plurality of signals having respective phases corresponding to the number of phases. The circuitry may be programmable to convert the plurality of signals to one or more digital signals.

In some embodiments, the circuitry may be configured to receive a selection of a sampling frequency. The circuitry may be configured to convert the plurality of signals to the one or more digital signals at least based on the sampling frequency.

In some embodiments, the number of coupled rings may be an integer L that is less than or equal to an integer N. The one or more ring oscillators may include a multi-ring oscillator having N rings that are coupled to each other. In configuring the one or more ring oscillators, the circuitry may be configured to configure the multi-ring oscillator to operate with L coupled rings out of the N coupled rings, as the configured one or more ring oscillators.

In some embodiments, the number of coupled rings may be an integer L that is less than or equal to an integer N. The one or more ring oscillators may include N ring oscillators, each having a different number of coupled rings to each other. In configuring the one or more ring oscillators, the circuitry may be configured to select a ring oscillator having L coupled rings, from among the N ring oscillators, as the configured one or more ring oscillators.

In some embodiments, the circuitry may include a plurality of circuits respectively configured to perform a plurality of modes of analog digital converter operations. The circuitry may be configured to select one or more circuits from among the plurality of circuits. The circuitry may be configured to cause the selected one or more circuits to convert the plurality of signals to the one or more digital signals.

Various embodiments disclosed herein are related to a device including one or more ring oscillators and circuitry. In some embodiments, the one or more ring oscillators may be configured to receive an input signal and output a plurality of signals. The circuitry may be configured to convert the plurality of signals from the one or more ring oscillators to one or more digital signals. The one or more ring oscillators may include a multi-ring oscillator having first-to-$N^{th}$ rings, each ring comprising first-to-$M^{th}$ differential amplifiers. N and M may be integers greater than 1. A multi-ring oscillator refers to a ring oscillator including a plurality of rings in each of which a plurality of buffers, delay stages, inverters, or amplifiers are connected, according to some embodiments. The term "differential amplifier" means an amplifier, a buffer, delay stage, or other electronic device that has at least two inputs and amplifies or outputs a difference between two inputs, according to some embodiments. In some embodiments, a differential amplifier may include at least one output (e.g., two outputs). Each differential amplifier may have a first input and a first output that have a first polarity, and a second input and a second output that have a second polarity. The first to $N^{th}$ rings may be cyclically coupled such that the second output of the $M^{th}$ differential amplifier of the $N^{th}$ ring is coupled to the first output of the first differential amplifier of the first ring. Cyclically coupled rings refer to a plurality of rings that are connected to one another such that buffers, delay stages, inverters or amplifiers of respective ones of the plurality of rings are coupled in a cycle, a ring, or a chain, according to some embodiments.

In some embodiments, the first to $N^{th}$ rings may be cyclically coupled such that the second input of the $M^{th}$ differential amplifier of the $N^{th}$ ring is coupled to the second output of the $M^{th}$ differential amplifier of the first ring.

In some embodiments, in each ring, the first output and the second output of the $i^{th}$ differential amplifier may be coupled to the first input and the second input of the $(i+1)^{th}$ differential amplifier, respectively, where i is an integer that is greater than or equal to 1 and less than M. The first output and the second output of the $M^{th}$ differential amplifier may be coupled to the second input and the first input of the first differential amplifier, respectively.

In some embodiments, the first outputs of the $i^{th}$ differential amplifiers of the N rings may be coupled to each other, where i is an integer that is greater than or equal to 1 and less than or equal to M. The second outputs of the $i^{th}$ differential amplifiers of the N rings may be coupled to each other.

In some embodiments, the circuitry may be configured to receive a selection of a number of coupled rings and a number of phases. The circuitry may be configured to configure the multi-ring oscillator to operate at least based on the number of coupled rings. The circuitry may be configured to cause the configured multi-ring oscillator to output the plurality of signals having respective phases corresponding to the number of phases. The circuitry may be configured to convert the plurality of signals from the configured multi-ring oscillator to one or more digital signals. The circuitry may be configured to receive a selection of a sampling frequency, and convert the plurality of signals from the configured multi-ring oscillator to the one or more digital signals at least based on the sampling frequency. The number of coupled rings may be an integer L that is less than or equal to N. In configuring the one or more ring oscillators, the circuitry may be configured to configure the multi-ring oscillator to operate with L coupled rings out of the N coupled rings, as the configured one or more ring oscillators.

In some embodiments, the circuitry may include a plurality of circuits respectively configured to perform a plurality of modes of analog digital converter operations. The circuitry may be configured to select one or more circuits from among the plurality of circuits, and cause the selected one or more circuits to convert the plurality of signals to the one or more digital signals.

Various embodiments disclosed herein are related to a method. The method includes receiving, by circuitry, a selection of a number of coupled rings and a number of phases. The method may include configuring, by the circuitry, one or more ring oscillators to operate at least based on the number of coupled rings. The one or more ring oscillators may include a plurality of rings. The method may include causing, by the circuitry, the configured one or more ring oscillators to receive an input signal and output a plurality of signals having respective phases corresponding to the number of phases. The method may include converting, by the circuitry, the plurality of signals to one or more digital signals.

In some embodiments, the circuitry may receive a selection of a sampling frequency. The circuitry may convert the plurality of signals to the one or more digital signals at least based on the sampling frequency.

In some embodiments, the number of coupled rings may be an integer L that is less than or equal to an integer N. The one or more ring oscillators may include a multi-ring oscillator having N rings that are coupled to each other. In configuring the one or more ring oscillators, the circuitry may configure the multi-ring oscillator to operate with L coupled rings out of the N coupled rings, as the configured one or more ring oscillators.

In some embodiments, the number of coupled rings may be an integer L that is less than or equal to an integer N. The one or more ring oscillators may be N ring oscillators, each having a different number of coupled rings to each other. In configuring the one or more ring oscillators, the circuitry may select a ring oscillator having L coupled rings, from among the N ring oscillators, as the configured one or more ring oscillators.

In some embodiments, the circuitry may include a plurality of circuits respectively configured to perform a plurality of modes of analog digital converter operations. The circuitry may select one or more circuits from among the plurality of circuits. The circuitry may cause the selected one or more circuits to convert the plurality of signals to the one or more digital signals.

In one aspect, in a ring oscillator-based ADC (e.g., VCRO-based ADC), the phase noise of the VCRO may be a major contributor to the noise floor of the ADC (e.g., the amount of noise generated by the ADC). For example, in wireless local area network (WLAN) radio receivers, it would be beneficial for an ADC to maintain the same or similar dynamic range over across different ranges of baseband bandwidth. Therefore, there is a need to reduce the phase noise of the VCRO in VCRO-based ADCs used in WLAN receivers.

To solve this problem, according to certain aspects, embodiments in the present disclosure relate to techniques for configuring a ring oscillator (e.g., VCRO) including a plurality of rings to improve/reduce phase noises and/or quantization noises of the VCRO. In some embodiments, the plurality of rings may be coupled to one another to improve/reduce phase noises and/or quantization noises of the VCRO. In some embodiments, the plurality of rings (e.g., L number of rings) may cyclically coupled in a VCRO (e.g., L-ring coupled VCRO), providing (1) approximately 10×log 10 (L) dB improvement in phase noise compared to a VCRO including a single ring (e.g., single-ring VCRO), and/or (2) improvement in the quantization noise of an ADC compared to an ADC using a single-ring VCRO. An L-ring coupled oscillator refers to a ring oscillator (e.g., VCRO) including L number of rings that are cyclically coupled together or to one another.

In some embodiments, an L-ring coupled oscillator may include a first ring, a second ring, ..., a $L^{th}$ ring, in each of which M number of delay stages (e.g., amplifier, buffer, inverter, etc.) are coupled/connected in ring. In some embodiments, each delay stage may include a differential amplifier that has at least two inputs and amplifies or outputs a difference between two inputs. In some embodiments, a differential amplifier may include at least one output (e.g., two outputs). In some embodiments, in each ring, outputs of a one delay stage may be coupled to inputs of a next delay stage next to or adjacent to the one delay stage, and outputs of an $M^{th}$ delay stage may be coupled to inputs of a first delay stage. For example, in each ring, an output phase of a non-inverting output of the first delay stage may be coupled to an output phase of a non-inverting input of the second delay stage, and so on. In each ring, an output phase of an inverting output of the first delay stage may be coupled to an output phase of an inverting input of the second delay stage, and so on. An output phase of an inverting output of the $M^{th}$ delay stage may be coupled to an output phase of a non-inverting input of the first delay stage, and an output phase of a non-inverting output of the $M^{th}$ delay stage may be coupled to an output phase of an inverting input of the first delay stage.

In some embodiments, L number of rings may be cyclically coupled such that output phases of the $L^{th}$ ring may be coupled to output phases of the first ring. For example, an output phase of an inverting output of the $M^{th}$ delay stage in the $L^{th}$ ring may be coupled to an output phase of a non-inverting output of the first delay stage in the first ring. The output phase of the non-inverting output of the first delay stage in the first ring may be coupled to an output phase of the non-inverting output of the first delay stage in the second ring, and so on. The output phase of the non-inverting output of the first delay stage in the $L^{th}$ ring may be coupled to an output phase of the non-inverting output of the second delay stage in the first ring. Similarly, for inverting outputs, an output phase of an inverting output of the first delay stage in the first ring may be coupled to an output phase of an inverting output of the first delay stage in the second ring, and so on. An output phase of an inverting output of the first delay stage in the $L^{th}$ ring may be coupled to an output phase of an inverting output of the second delay stage in the first ring. An output phase of an inverting output of the $(M-1)^{th}$ delay stage in the $L^{th}$ ring may be coupled to an output phase of an inverting output of the $M^{th}$ delay stage in the first ring.

Coupling L number of rings (in a ring oscillator) in this manner can reduce the phase noise of the ring oscillator (e.g., VCRO) by approximately 10*log 10 (L) dB compared to a single-ring VCRO. Moreover, the multi-ring coupled VCRO according to some embodiments can improve the quantization noise (in a VCRO-based ADC) compared to an ADC including a single-ring VCRO.

In another aspect, it would be beneficial if the power consumption of an ADC can scale with bandwidths because it can keep the chip power consumption low in the lowest bandwidth. For example, in WLAN receivers with different process sizes, it would be beneficial for an ADC, which may use a successive approximation register (SAR) architecture, to consume power proportional to bandwidths, while maintaining the same or similar dynamic range across all baseband bandwidth ranges. Conventional VCRO-based ADCs may either support only one bandwidth or support multiple bandwidths with the same power consumption. In the latter cases, the same or fixed power consumption may be dictated by the highest bandwidths supported, which makes the ADC power consumption inefficient in the lowest bandwidths supported. Therefore, there is a need to scale the power consumption of an ADC with bandwidths, for example, when using VCRO-based ADCs in WLAN receivers.

To solve this problem, according to certain aspects, embodiments in the present disclosure relate to techniques for providing a multi-mode ADC including a ring oscillator (e.g., VCRO). A multi-mode or multiple modes of ADC operations refer to different configurations of a plurality of components of an ADC (e.g., ring oscillator, sampling circuitry, phase decoder, differentiator, decimator, or other components), or other configuration that may produce different power consumption characteristics of the ADC (e.g., power consumption with respect to bandwidths, dynamic ranges, phase noise, quantization noise, etc.), according to some embodiments. In some embodiments, the multi-mode ADC including a ring oscillator can scale the power consumption of the ADC depending on bandwidth requirements and/or dynamic range requirements.

In some embodiments, a multi-mode ADC may include a ring oscillator (e.g., VCRO), sampling circuitry, conversion circuitry, and/or control circuitry. The ring oscillator may receive an analog signal (e.g., input voltage for the VCRO) as ADC input and output phase data including a plurality of phase outputs. The sampling circuitry may receive the plurality of phase outputs and output sampled phase data including a plurality of sampled phase outputs. The conversion circuitry may receive the sampled phase data, convert the sampled phase data to one or more digital signals, and output the one or more digital signals as ADC output. The control circuitry may receive control inputs and configure/operate components of the ADC (e.g., ring oscillator, sampling circuitry, conversion circuitry) via one or more control signals according to the received control inputs. In some embodiments, input configuration of the multi-mode ADC may be single-ended. In some embodiments, input configuration of the multi-mode ADC may be pseudo differential.

In some embodiments, the ring oscillator may include a plurality of rings (e.g., N number of rings) and may be implemented as a single ring oscillator instance (e.g., a single VCRO) with a programmable/adjustable number of coupled rings. For example, in response to receiving a control signal indicating L number of coupled rings, the ring oscillator may dynamically configure/adjust L number of rings to be cyclically coupled among the N number of rings.

In some embodiments, the ring oscillator may implemented as separate ring oscillator instances (e.g., N number of VCROs) each with a different number of coupled rings. For example, the ring oscillator may include N ring oscillators which include a single-ring oscillator, a dual-ring coupled oscillator, a 3-ring coupled oscillator, . . . , a N-ring coupled oscillator. In response to receiving a control signal indicating L number of coupled rings, the ring oscillator may select the L-ring coupled oscillator among the N ring oscillators. The implementation of single ring oscillator instance can compromise performance for area saving, while the implementation of separate ring oscillator instances can sacrifice some extra area for better performance.

In some embodiments, the multi-mode ADC (or the control circuitry thereof) may receive, as control inputs, a number of coupled rings in the ring oscillator (L), a number of phase outputs from the ring oscillator ($N_\phi$), and an ADC sampling frequency ($f_s$) to scale the power consumption of the ADC for different bandwidth requirements and/or dynamic range requirements. In some embodiments, each of the number of coupled rings (L), the number of phase outputs ($N_\phi$), and the sampling frequency ($f_s$) may be programmable or selectable such that the values L, $N_\phi$, and/or $f_s$ can be dynamically changed by external control inputs or user selection. In response to receiving/selecting the values L, $N_\phi$, and/or $f_s$, the multi-mode ADC may be configured to use L number of coupled rings, $N_\phi$ number of phase output from the ring oscillator, and/or the sampling frequency ($f_s$) to scale the power consumption of the ADC to meet the bandwidth requirements and/or dynamic range requirements. In this manner, the multi-mode ADC (which may be used in a radio receiver) can efficiently consume the power with a limited power budget.

In some embodiments, the control circuitry may configure the ring oscillator to operate using L number of coupled rings via a control signal. In some embodiments, the control circuitry may configure, via a control signal, the ring oscillator to output $N_\phi$ number of phase outputs. In some embodiments, the control circuitry may generate a clock signal according to the sampling frequency ($f_s$) and provide the clock signal to the sampling circuitry and the conversion circuitry so that the sampling circuitry and the conversion circuitry operate according to the sampling frequency ($f_s$). In some embodiments, the sampling frequency is the number of samples per time unit, such as per second, taken from a signal, such as the number of discrete time signals (e.g., values of signals at discrete points in time) per time unit, taken from a continuous time signal (e.g., analog signal).

In some embodiments, the sampling circuitry may include a counter configured to output K number of bits, and a plurality of sampling D flip-flops (DFFs). In response to receiving a first phase output (among the $N_\phi$ number of phase outputs) from the ring oscillator, the counter may be configured to count a number of cycles in the first phase output (e.g., sine wave signal or square wave signal) and output the number of cycles in K bit as a rate of the original phase data (before sampling). In response to receiving the $N_\phi$ number of phase outputs from the ring oscillator, the plurality of sampling DFFs may be configured to sample phase outputs according to the sampling frequency ($f_s$) and output sampled phase data. In response to receiving the rate of the original phase data and sampled phase outputs (from the sampling DFFs), the conversion circuitry may be configured to convert the sampled phase data to one or more digital signals, and output the one or more digital signals as ADC output. In this manner, the multi-mode ADC can improve/reduce phase noises and/or quantization noises of the ADC according to a programmable/selectable number of coupled rings. The multi-mode ADC can also scale the power consumption of the ADC across all baseband bandwidth (frequency) ranges to meet the bandwidth requirements and/or dynamic range requirements.

In some embodiments, the conversion circuitry may include a plurality of mode circuits and selection circuitry configured to select one or more mode circuits of the plurality of mode circuits. In some embodiments, each of the plurality of mode circuits may include a phase decoder, one or more differentiators, and/or a decimator. The phase decoder ($\phi$-decoder) may be configured to map/decode/convert the sampled phases to quantized phases (e.g., as 1-bit stream). The differentiators may be configured to calculate the difference between the current sample and the previous sample, e.g., s [n]−s [n−1]. The decimator may be configured to down-sample the sampled phase data based on a rate of the original phase data (which is output from the sampling circuitry). In some embodiments, each of the plurality of mode circuits may have different configurations/arrangements of the phase decoder, one or more differentiators, and/or a decimator.

The selection circuitry may include a plurality of AND gates each receiving a clock signal and an internal mode selection signal from the control circuitry. In some embodiments, the control circuitry may receive, as a control input, one or more external mode selection signals and control the selection circuitry to select one or more mode circuits of the plurality of mode circuits via one or more internal mode selection signals according to the one or more external mode selection signals. In response to receiving the one or more internal mode selection signals, the selection circuitry may enable corresponding AND gates via the one or more internal mode selection signals such that the selected mode circuits can operate. In response to receiving a rate of the original phase data and sampled phase data from the sampling circuitry, the selected mode circuits may be configured to operate at least one of a phase decoder, one or more differentiators, and/or a decimator thereof to convert the sampled phase data to one or more digital signals, and output the one or more digital signals as ADC output. In some embodiments, the phase decoder, differentiators, and decimator can be separately implemented for different modes which can save power in low bandwidth/dynamic range modes at the cost of some extra area. Alternatively, the conversion circuitry may include a single logic block that can be configured for different modes, which would save area at the cost of some extra power especially in low bandwidth/dynamic range modes.

Embodiments in the present disclosure have at least the following advantages and benefits. First, embodiments in the present disclosure can provide useful techniques for a multi-mode ADC to scale its power consumption across all baseband bandwidth ranges while maintaining the same or similar dynamic range across all baseband bandwidth ranges. In some embodiments, the multi-mode ADC including a plurality of rings may receive, as control inputs, a number of coupled rings in the ring oscillator (L), a number of phase outputs from the ring oscillator ($N_\phi$), and an ADC sampling frequency ($f_s$) to scale the power consumption of the ADC for different bandwidth requirements and/or dynamic range requirements. In response to receiving/selecting the values L, $N_\phi$, and/or $f_s$, the multi-mode ADC may be configured to use L number of coupled rings, $N_\phi$ number of phase output from the ring oscillator, and/or the sampling frequency ($f_s$) to scale the power consumption of the ADC to meet the bandwidth requirements and/or dynamic range requirements. In this manner, the multi-mode ADC (which may be used in a radio receiver) can efficiently consume the power with a limited power budget.

Second, embodiments in the present disclosure can provide useful techniques for configuring a ring oscillator (e.g., VCRO) including a plurality of rings to improve/reduce phase noises and/or quantization noises of the VCRO. In some embodiments, the plurality of rings may be coupled to one another to improve/reduce phase noises and/or quantization noises of the VCRO. In some embodiments, the plurality of rings (e.g., L number of rings) may cyclically coupled in a VCRO (e.g., L-ring coupled VCRO), providing (1) approximately 10×log 10 (L) dB improvement in phase noise compared to a VCRO including a single ring (e.g., single-ring VCRO), and/or (2) improvement in the quantization noise of an ADC compared to an ADC using a single-ring VCRO.

Third, embodiments in the present disclosure can provide useful techniques for operating an ADC in multiple modes of operations which correspond to different configurations of a plurality of components of the ADC (e.g., ring oscillator, sampling circuitry, phase decoder, differentiator, decimator, or other components), or other configuration that may produce different power consumption characteristics of the ADC (e.g., power consumption with respect to bandwidths, dynamic ranges, phase noise, quantization noise, etc.). In some embodiments, a multi-mode ADC may receive, as a control input, one or more external mode selection signals and select one or more mode circuits of the plurality of mode circuits via one or more internal mode selection signals according to the one or more external mode selection signals. In this manner, the multi-mode ADC can be selectably operated in one or more desirable configurations.

FIG. 1 is a schematic block diagram of a device 100 (e.g., multi-mode ADC) for operating an analog-to-digital converter (ADC) in multiple modes, in accordance with an embodiment. Referring to FIG. 1, a multi-mode ADC 100 may include a ring oscillator 120 (e.g., VCRO), sampling circuitry 140, conversion circuitry 160, and/or control circuitry 150. The ring oscillator 120 may receive an analog signal (e.g., input voltage for the VCRO) as ADC input 101 and output phase data 121 including a plurality of phase outputs. The sampling circuitry 140 may receive the plurality of phase outputs and output sampled phase data 142 including a plurality of sampled phase outputs. The conversion circuitry 160 may receive the sampled phase data 142, convert the sampled phase data to one or more digital signals, and output the one or more digital signals as ADC output 105. The control circuitry 150 may receive control inputs 103 and configure/operate components of the ADC (e.g., ring oscillator 120, sampling circuitry 140, conversion circuitry 160) via one or more control signals (e.g., control signals 151, 152, 153) according to the received control inputs 103. In some embodiments, input configuration of the multi-mode ADC may be single-ended. In some embodiments, input configuration of the multi-mode ADC may be pseudo differential.

Figure 2A:
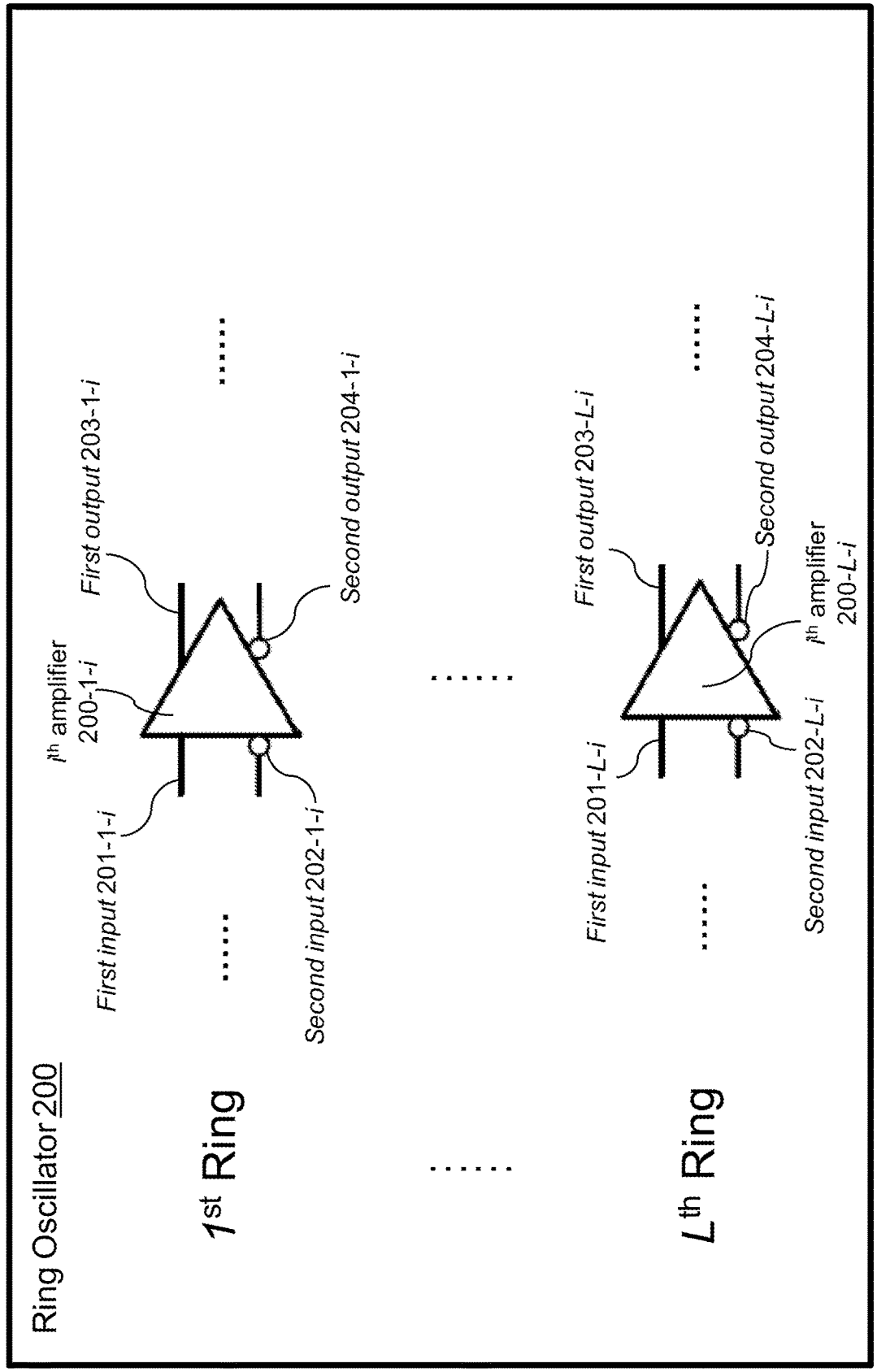
FIG. 2A to FIG. 2C are schematic block diagrams of a ring oscillator, in accordance with an embodiment.
Figure 2B:
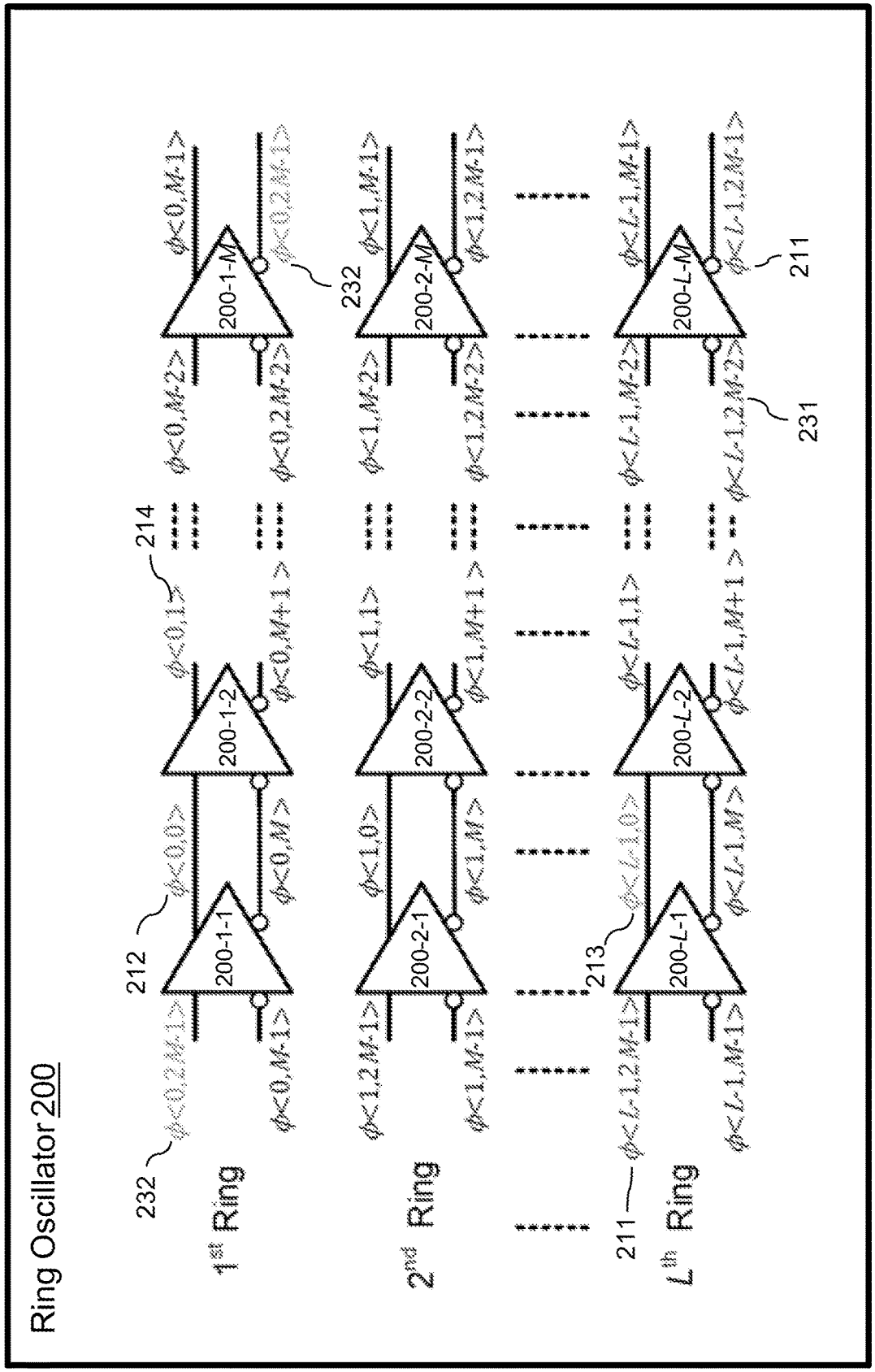
Figure 2C:
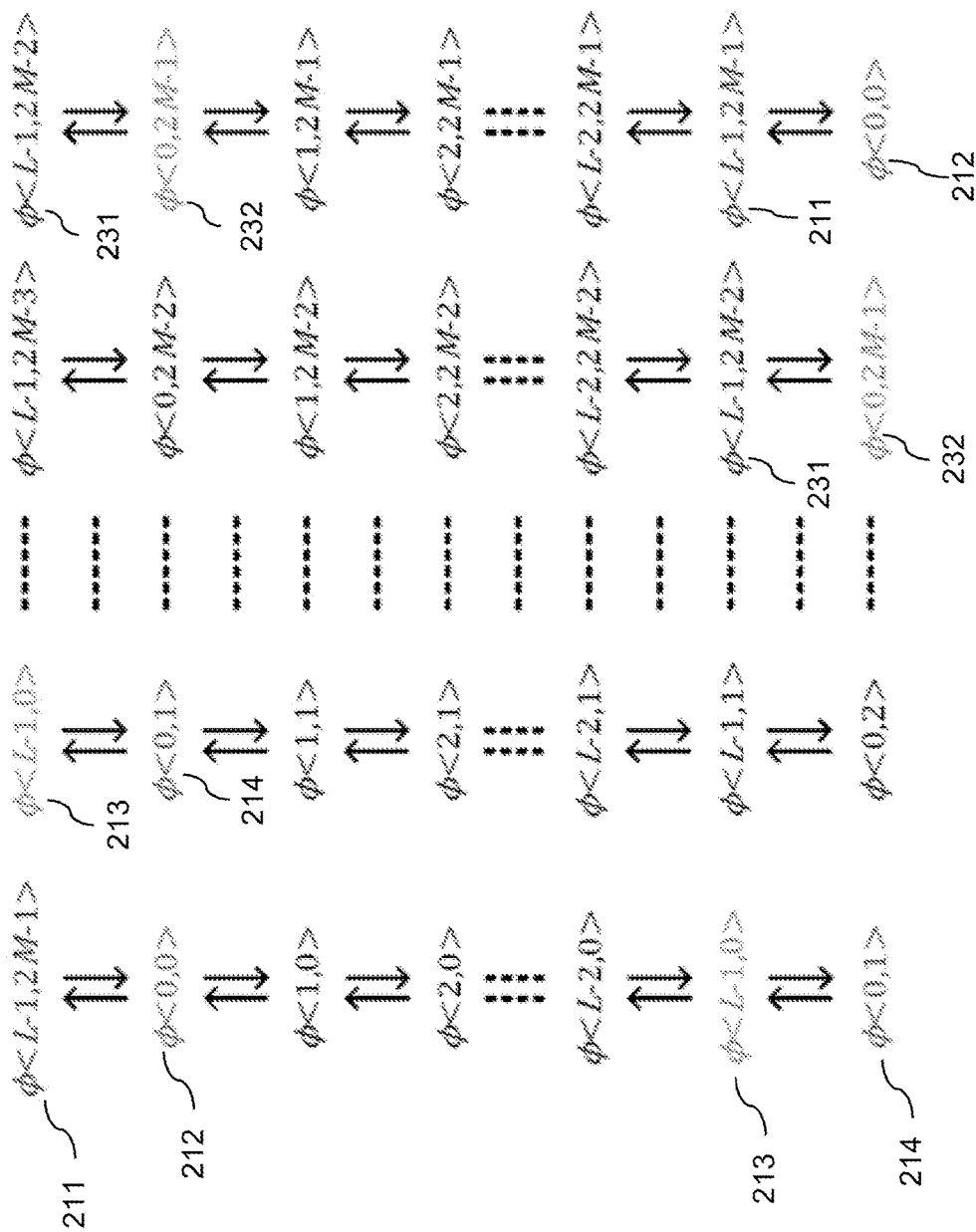

FIG. 2A to FIG. 2C are schematic block diagrams of a ring oscillator 200, in accordance with an embodiment. The ring oscillator 200 (e.g., VCRO) may include a plurality of rings (e.g., first ring, second ring, . . . , $L^{th}$ ring) to improve/reduce phase noises and/or quantization noises of the VCRO. In some embodiments, the plurality of rings (e.g., L number of rings) may cyclically coupled in a VCRO (e.g., L-ring coupled VCRO), providing (1) approximately 10×log 10 (L) dB improvement in phase noise compared to a VCRO including a single ring (e.g., single-ring VCRO), and/or (2) improvement in the quantization noise of an ADC compared to an ADC using a single-ring VCRO. As noted above, an L-ring coupled oscillator refers to a ring oscillator (e.g., VCRO) including L number of rings that are cyclically coupled together or to one another.

Referring to FIG. 2A, an L-ring coupled oscillator may include a first ring, a second ring, . . . , a $L^{th}$ ring, in each of which M number of delay stages (e.g., amplifier, buffer, inverter, etc.) are coupled/connected in ring. In some embodiments, each delay stage may include a differential amplifier that has at least two inputs and amplifies or outputs a difference between two inputs. In some embodiments, a differential amplifier may include at least one output (e.g., two outputs). For example, in the first ring, an $i^{th}$ (differential) amplifier 200-1-$i$ may have a first (non-inverting) input 201-1-$i$, a second (inverting) input 202-1-$i$, a first (non-inverting) output 203-1-$i$, and a second (inverting) output 204-1-$i$. Similarly, in the $L^{th}$ ring ring, an $i^{th}$ (differential) amplifier 200-L-i may have a first (non-inverting) input 201-L-i, a second (inverting) input 202-L-i, a first (non-inverting) output 203-L-i, and a second (inverting) output 204-L-i.

Referring to FIG. 2B, in each ring, outputs of a one delay stage may be coupled to inputs of a next delay stage next to or adjacent to the one delay stage, and outputs of an $M^{th}$ delay stage may be coupled to inputs of a first delay stage. For example, in the first ring, an output phase ϕ<0, 0> of a non-inverting output of the first delay stage 200-1-1 may be coupled to an output phase of a non-inverting input of the second delay stage 200-1-2, and so on. In the first ring, an output phase ϕ<0, M> of an inverting output of the first delay stage 200-1-1 may be coupled to an output phase of an inverting input of the second delay stage 200-1-2, and so on. An output phase $\phi<0, 2M-1>$ of an inverting output of the $M^{th}$ delay stage may be coupled to an output phase of a non-inverting input of the first delay stage 200-1-1, and an output phase $\phi<0, M-1>$ of a non-inverting output of the $M^{th}$ delay stage may be coupled to an output phase of an inverting input of the first delay stage 200-1-1.

Referring to FIG. 2B and FIG. 2C, L number of rings may be cyclically coupled such that output phases of the $L^{th}$ ring may be coupled to output phases of the first ring. For example, an output phase 211 of an inverting output of the $M^{th}$ delay stage in the $L^{th}$ ring (200-L-M) may be coupled to an output phase 212 of a non-inverting output of the first delay stage in the first ring (200-1-1). The output phase 212 of the non-inverting output of the first delay stage in the first ring (200-1-1) may be coupled to an output phase $\phi<1, 0>$ of a non-inverting output of the first delay stage in the second ring (200-2-1), and so on. The output phase 213 of the non-inverting output of the first delay stage in the $L^{th}$ ring (200-L-1) may be coupled to an output phase 214 of the non-inverting output of the second delay stage in the first ring (200-1-2). Similarly, for inverting outputs, an output phase $\phi<0, M>$ of an inverting output of the first delay stage in the first ring (200-1-1) may be coupled to an output phase $\phi<1, M>$ of an inverting output of the first delay stage in the second ring (200-2-1), and so on. An output phase $\phi<L-1, M>$ of an inverting output of the first delay stage in the $L^{th}$ ring (200-L-1) may be coupled to an output phase $\phi<0, M+1>$ of an inverting output of the second delay stage in the first ring (200-1-2). An output phase 231 of an inverting output of the $(M-1)^{th}$ delay stage in the $L^{th}$ ring (200-L-(M-1)) may be coupled to an output phase of an inverting output 232 of the $M^{th}$ delay stage in the first ring (200-1-M).

Referring to FIG. 2A to FIG. 2C, a multi-ring oscillator (e.g., ring oscillator 200) having first-to-$L^{th}$ rings, each ring comprising first-to-$M^{th}$ differential amplifiers (e.g., differential amplifiers 200-1-1, 200-1-2, . . . , 200-1-M in the first ring. each of L and M may be an integer greater than 1. Each differential amplifier (e.g., $i^{th}$ amplifier 200-1-$i$) may have a first input 201-1-$i$ and a first output 203-1-$i$ that have a first polarity (e.g., non-inverting input/output), and a second input 202-1-$i$ and a second output 204-1-$i$ that have a second polarity (e.g., inverting input/output). The first to $L^{th}$ rings may be cyclically coupled such that the second output 211 of the $M^{th}$ differential amplifier of the $L^{th}$ ring (200-L-M) is coupled to the first output 212 of the first differential amplifier of the first ring (200-1-1). In some embodiments, the first to $L^{th}$ rings may be cyclically coupled such that the second input 231 of the $M^{th}$ differential amplifier of the $L^{th}$ ring (200-L-M) is coupled to the second output 232 of the $M^{th}$ differential amplifier of the first ring (200-1-M).

In some embodiments, in each ring, the first output and the second output of the $i^{th}$ differential amplifier (e.g., 200-1-$i$) may be coupled to the first input and the second input of the $(i+1)^{th}$ differential amplifier (e.g., 200-1-($i$+1)), respectively, where i is an integer that is greater than or equal to 1 and less than M. The first output (e.g., $\phi<0, M-1>$) and the second output (e.g., $\phi<0, 2M-1>$) of the $M^{th}$ differential amplifier (e.g., 200-1-M) may be coupled to the second input and the first input of the first differential amplifier (e.g., 200-1-1), respectively. In some embodiments, the first outputs of the $i^{th}$ differential amplifiers of the L rings (e.g., first outputs of the amplifiers 200-1-$i$, 200-2-$i$, . . . , 200-L-$i$) may be coupled to each other, where i is an integer that is greater than or equal to 1 and less than or equal to M. The second outputs of the $i^{th}$ differential amplifiers of the N rings (e.g., second outputs of the amplifiers 200-1-$i$, 200-2-$i$, . . . , 200-L-$i$) may be coupled to each other.

In some embodiments, a ring oscillator may include a plurality of rings (e.g., N number of rings) and may be implemented as a single ring oscillator instance (e.g., a single VCRO) with a programmable/adjustable number of coupled rings. For example, in response to receiving a control signal indicating L number of coupled rings, the ring oscillator may dynamically configure/adjust L number of rings to be cyclically coupled (in a manner shown in FIG. 2A to FIG. 2C) among the N number of rings.

Figure 3:
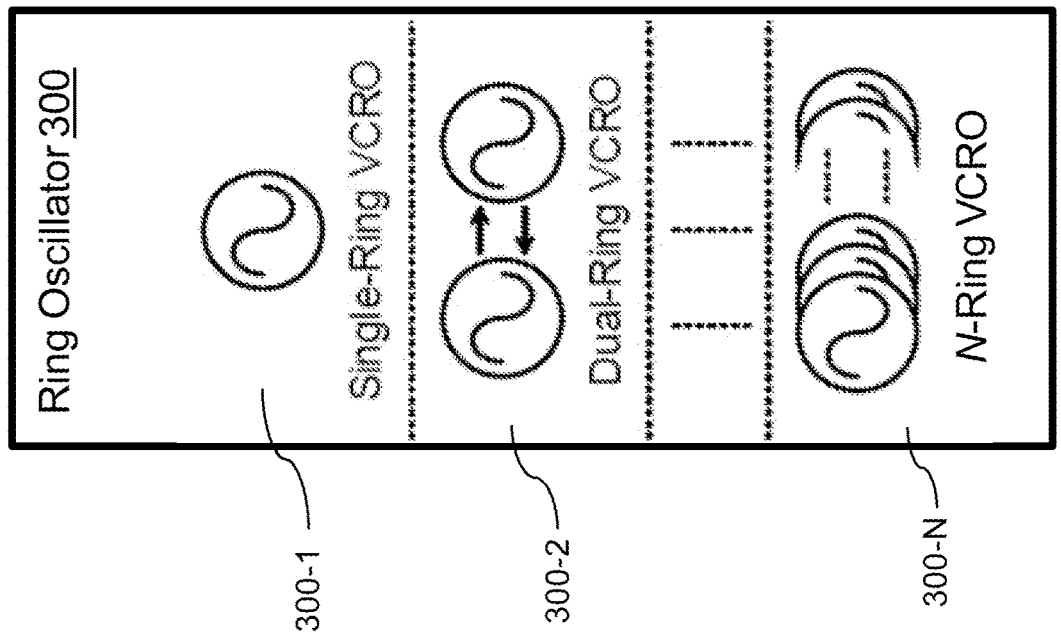
FIG. 3 is a schematic block diagram of one or more ring oscillators, in accordance with an embodiment.

In some embodiments, the ring oscillator may be implemented as separate ring oscillator instances (e.g., N number of VCROs) each with a different number of coupled rings. FIG. 3 is a schematic block diagram of one or more ring oscillators, in accordance with an embodiment. For example, the ring oscillator 300 may include N ring oscillators which include a single-ring oscillator 300-1, a dual-ring coupled oscillator 300-2, a 3-ring coupled oscillator, . . . , a N-ring coupled oscillator 300-N. In response to receiving a control signal indicating L number of coupled rings, the ring oscillator 300 may select the L-ring coupled oscillator 300-L among the N ring oscillators. The implementation of single ring oscillator instance (as shown in FIG. 2A to FIG. 2B) can compromise performance for area saving, while the implementation of separate ring oscillator instances (as shown in FIG. 3) can sacrifice some extra area for better performance.

Figure 4:
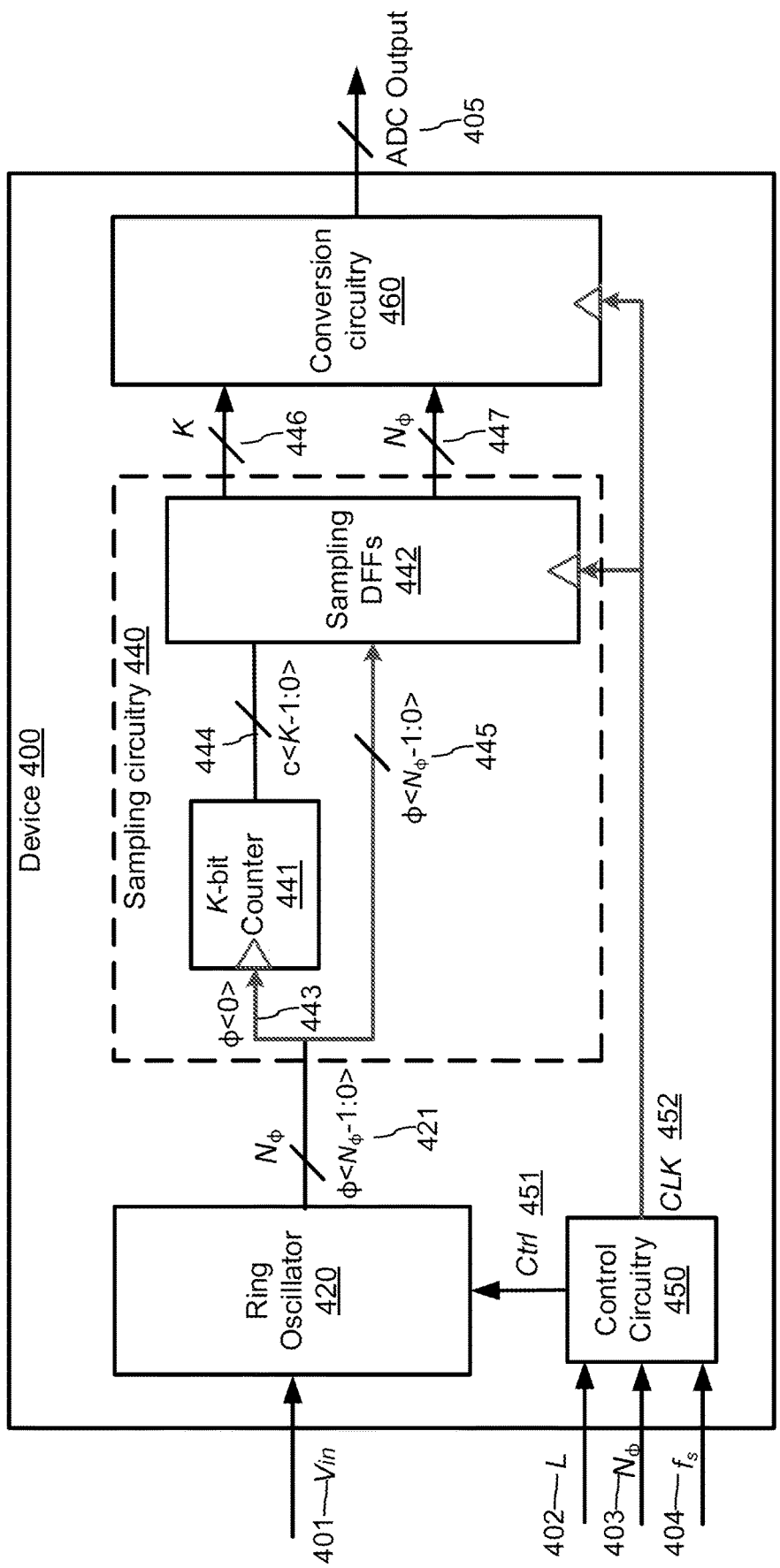
FIG. 4 is a schematic block diagram of a device for operating an ADC in multiple modes using one or more ring oscillators, in accordance with an embodiment.

FIG. 4 is a schematic block diagram of a device 400 (e.g., multi-mode ADC) for operating an ADC in multiple modes using one or more ring oscillators 420, in accordance with an embodiment. Referring to FIG. 4, the multi-mode ADC 400 may include a ring oscillator 420 (e.g., VCRO), sampling circuitry 440, conversion circuitry 460, and/or control circuitry 450. In some embodiments, the control circuitry 450 may receive, as control inputs, a number of coupled rings in the ring oscillator (L) 402, a number of phase outputs from the ring oscillator ($N_\phi$) 403, and an ADC sampling frequency ($f_s$) 404 to scale the power consumption of the ADC for different bandwidth requirements and/or dynamic range requirements.

In some embodiments, the ring oscillator 420 may include N number of rings and may be configure/adjust one or more rings, among the N number of rings, to be cyclically coupled (in a manner shown in FIG. 2A to FIG. 2C). In some embodiments, the ring oscillator 420 may N ring oscillators which include a single-ring oscillator, a dual-ring coupled oscillator, a 3-ring coupled oscillator, . . . , a N-ring coupled oscillator (as shown in FIG. 3), and may select one of the N ring oscillators. In response to receiving the number of coupled rings L and the number of phase outputs $N_\phi$, the multi-mode ADC 400 (or the control circuitry 450 thereof) may configure/control, via a control signal 451, the ring oscillator 420 to use L number of coupled rings to output $N_\phi$ number of phase outputs 421 ($\phi<N_\phi-1:0>$). The ring oscillator 420 may receive an input voltage $V_{in}$ 401 and output phase outputs 421 to the sampling circuitry 440. In some embodiments, each of the $N_\phi$ number of phase outputs 421 may be obtained/generated/outputted from an output of a differential amplifier of the L number of coupled rings.

In some embodiments, the control circuitry 450 may generate a clock signal 452 according to the sampling frequency ($f_s$) 404 and provide the clock signal 452 to the sampling circuitry 440 (e.g., sampling D flip-flops (DFFs) 422) and the conversion circuitry 460 so that the sampling circuitry 440 and the conversion circuitry 460 operate according to the sampling frequency ($f_s$).

In some embodiments, the sampling circuitry 440 may receive the $N_\phi$ number of phase outputs 421 (e.g., $\phi<N_\phi-1{:}0>$) and output $N_\phi$ number of sampled phase outputs 447. In some embodiments, the sampling circuitry 440 may include a counter 441 configured to output K number of bits 443 (e.g., c<K–1:0>), and a plurality of sampling DFFs 442. In response to receiving a first phase output 443 (e.g., $\phi<0>$) (among the $N_\phi$ number of phase outputs 421) from the ring oscillator 420, the counter 441 may be configured to count a number of cycles in the first phase output (e.g., sine wave signal or square wave signal) and output the number of cycles in K number of bit (e.g., c<K–1:0>) as a rate of the original phase data 444 (before sampling). In response to receiving the $N_\phi$ number of phase outputs 445 (e.g., $\phi<N_\phi-1{:}0>$) from the ring oscillator 420, the plurality of sampling DFFs 442 may be configured to sample phase outputs according to the sampling frequency ($f_s$) 404 and output $N_\phi$ number of sampled phase data 447.

In response to receiving the rate of the original phase data 446 and sampled phase outputs 447, the conversion circuitry 460 may be configured to convert the sampled phase data 447 to one or more digital signals and output the one or more digital signals as ADC output 405. In this manner, the multi-mode ADC 400 can improve/reduce phase noises and/or quantization noises of the ADC according to a programmable/selectable number of coupled rings. The multi-mode ADC 400 can also scale the power consumption of the ADC across all baseband bandwidth (frequency) ranges to meet the bandwidth requirements and/or dynamic range requirements.

In some embodiments, circuitry (e.g., the control circuitry 450) may be configured to receive a selection of a number of coupled rings (e.g., number of coupled rings L) and a number of phases (e.g., number of output phases $N_\phi$). A phase refers to a quantity (e.g., a fraction of the full cycle or an angle in radian) representing a position of a point or signal in time on a cycle of a waveform (e.g., sine waveform, square waveform). The number of output phases $N_\phi$ refers to the number of output signals from a ring oscillator that have different phases from each other. The circuitry (e.g., the control circuitry 450) may be configured to configure the multi-ring oscillator 420 including N number of rings to operate at least based on the number of coupled rings L. The circuitry (e.g., the control circuitry 450) may be configured to cause the configured multi-ring oscillator 420 to output the plurality of signals 421 (e.g., $\phi<N_\phi-1{:}0>$) having respective phases corresponding to the number of phases No. The circuitry (e.g., the sampling circuitry 440, the conversion circuitry 460) may be configured to convert the plurality of signals 421 (e.g., $\phi<N_\phi-1{:}0>$) from the configured multi-ring oscillator 420 to one or more digital signals (e.g., ADC output 405). The circuitry (e.g., the control circuitry 450, the sampling circuitry 440, the conversion circuitry 460) may be configured to receive a selection of a sampling frequency ($f_s$), and convert the plurality of signals 421 (e.g., $\phi<N_\phi-1{:}0>$) from the configured multi-ring oscillator 420 to the one or more digital signals at least based on the sampling frequency ($f_s$). The number of coupled rings may be an integer L that is less than or equal to N. In configuring the one or more ring oscillators (e.g., the multi-ring oscillator 420), the circuitry may be configured to configure the multi-ring oscillator 420 to operate with L coupled rings out of the N coupled rings, as the configured one or more ring oscillators.

Figure 5:
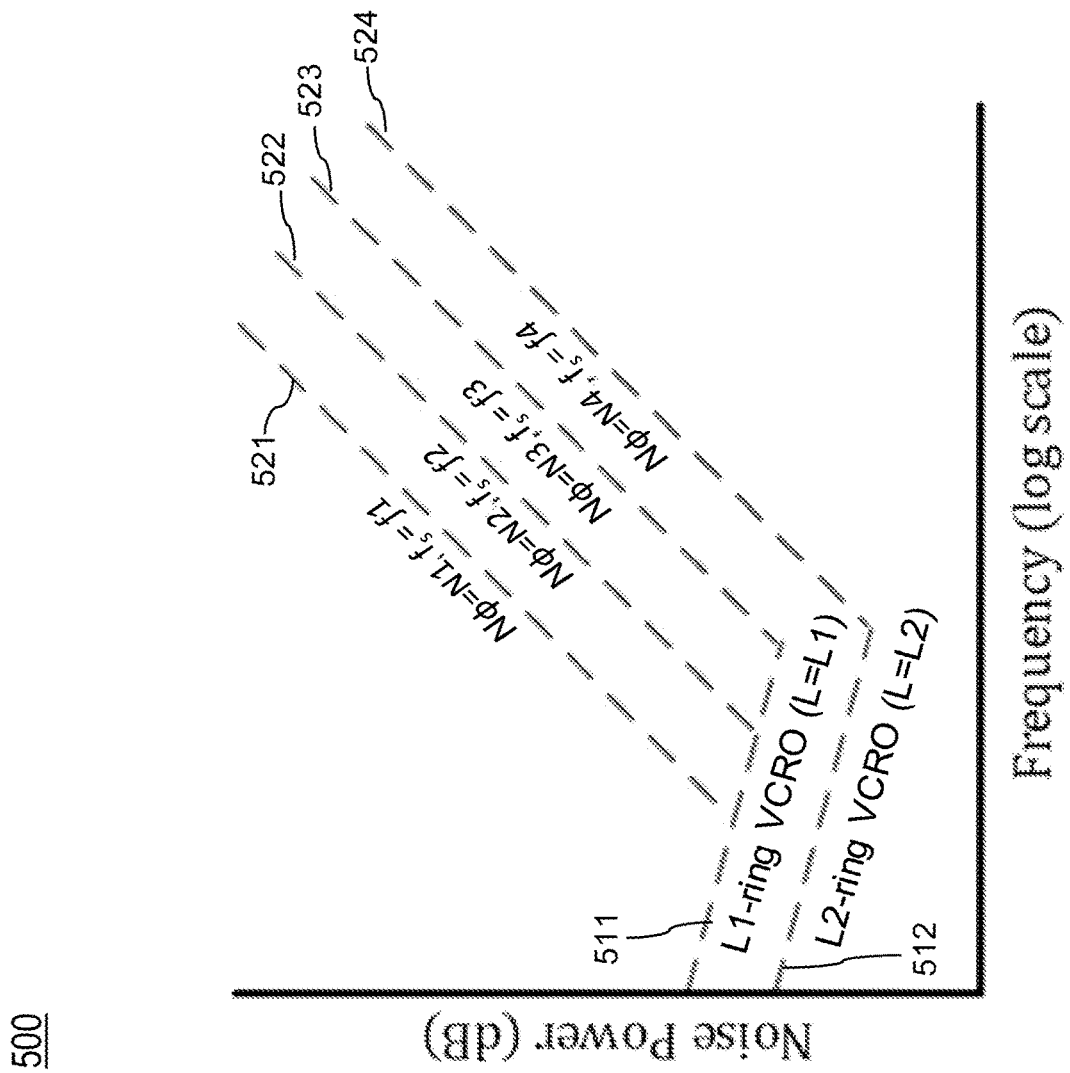
FIG. 5 is a diagram showing noise power over different frequencies when using a device for operating an ADC in multiple modes, in accordance with an embodiment.

FIG. 5 is a diagram 500 showing noise power (in y-axis) over different frequencies (in x-axis) when using a device (e.g., multi-mode ADC 400) for operating an ADC in multiple modes, in accordance with an embodiment. FIG. 5 shows that as the programmable/selectable number coupled rings L increases (e.g., from a L1-ring VCRO (L=L1) to a L2-ring VCRO (L=L2>L1)), the phase noises and/or quantization noises of the multi-mode ADC 400 may decrease (see lines 511, 512). FIG. 5 also shows that the noise power of the ADC scales for different configurations depending on different bandwidth requirements and/or dynamic range requirements. For example, each of the lines 521, 522, 523, 524 linearly increases across all bandwidth ranges, while different combinations of programmable/selectable values $N_\phi$ and $f_s$ in the lines 521, 522, 523, 524 meet different bandwidth requirements and/or dynamic range requirements. Although not shown in FIG. 5, it could be understood that the power consumption of the ADC is proportional to the number of rings, number of phases, and the sampling frequency.

Figure 6:
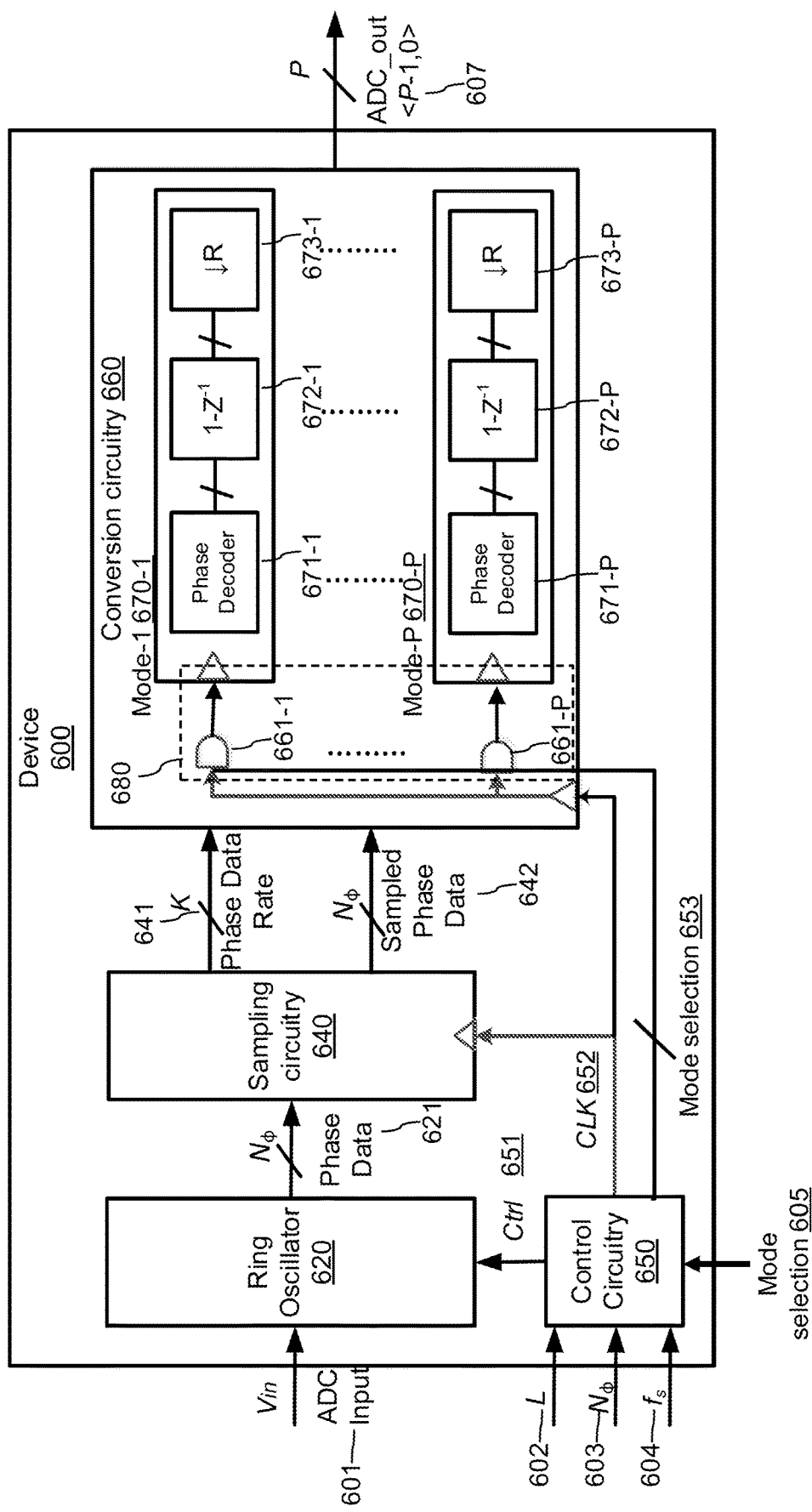
FIG. 6 is a schematic block diagram of a device for operating an ADC in multiple modes using one or more ring oscillators, in accordance with an embodiment.

FIG. 6 is a schematic block diagram of a device 600 (e.g., multi-mode ADC) for operating an ADC in multiple modes using one or more ring oscillators 620, in accordance with an embodiment. Referring to FIG. 6, the multi-mode ADC 600 may include a ring oscillator 620 (e.g., VCRO), sampling circuitry 640, conversion circuitry 660, and/or control circuitry 650. In some embodiments, the control circuitry 650 may receive, as control inputs, a number of coupled rings in the ring oscillator (L) 602, a number of phase outputs from the ring oscillator ($N_\phi$) 603, and an ADC sampling frequency ($f_s$) 604 to scale the power consumption of the ADC for different bandwidth requirements and/or dynamic range requirements. The control circuitry 650 may receive, as control inputs, one or more external mode selection signals 605 which may indicate selection of one or more mode circuits among a plurality of mode circuits (e.g., P number of mode circuits including a mode-1 circuit 670-1, . . . , a mode-P circuit 670-P). In some embodiments, the one or more external mode selection signals 605 may include a plurality of signals corresponding to P number of mode circuits, each signal indicating whether the corresponding mode circuit is selected (e.g., signal indicating value "1") or not selected (e.g., signal indicating value "0").

In some embodiments, the ring oscillator 620 may have a configuration similar to that of the ring oscillator 420. In response to receiving the number of coupled rings L and the number of phase outputs $N_\phi$, the control circuitry 650 may configure/control, via a control signal 651, the ring oscillator 620 to use L number of coupled rings to output $N_\phi$ number of phase outputs 621. The ring oscillator 620 may receive an input voltage $V_{in}$ 601 and output the $N_\phi$ number of phase outputs 621 (e.g., $\phi<N_\phi-1{:}0>$) to the sampling circuitry 640. In some embodiments, the control circuitry 650 may generate a clock signal 652 according to the sampling frequency ($f_s$) 604 and provide the clock signal 652 to the sampling circuitry 640 and the conversion circuitry 660 so that the sampling circuitry 640 and the conversion circuitry 660 operate according to the sampling frequency ($f_s$). The sampling circuitry 640 may be configured to sample phase outputs according to the sampling frequency ($f_s$) 604 and output $N_\phi$ number of sampled phase data 642 (e.g., sampled $\phi<N_\phi-1{:}0>$) and the rate of the original phase data 641.

In some embodiments, the conversion circuitry 660 may include a plurality of mode circuits (e.g., P number of mode circuits including a mode-1 circuit 670-1, . . . , a mode-P circuit 670-P) and selection circuitry 680 configured to select one or more mode circuits of the plurality of mode circuits. In some embodiments, each of the plurality of mode circuits may include a phase decoder (e.g., phase decoder 671-1, . . . , 671-P), one or more differentiators (e.g., differentiator 672-1, . . . , 672-P), and/or a decimator (e.g., decimator 673-1, . . . , 673-P). The phase decoder (e.g., ϕ-decoder for $i^{th}$ sampled phase ϕ<i−1>) may be configured to map/decode/convert the respective sampled phase (e.g., $i^{th}$ sampled phase ϕ<i−1>) to quantized phases (e.g., as 1-bit stream). The differentiators may be configured to calculate the difference between the current sample and the previous sample, e.g., s[n]−s[n−1]. The decimator may be configured to down-sample the sampled phase data based on the rate of the original phase data 641 which is output from the sampling circuitry 640. In some embodiments, each of the plurality of mode circuits 670-1, . . . , 670-P may have different configurations/arrangements of the phase decoder, one or more differentiators, and/or a decimator.

In some embodiments, the control circuitry 650 may generate one or more internal mode selection signals 653 according to the one or more external mode selection signals 605 and provide the one or more internal mode selection signals 653 to the conversion circuitry 660. In some embodiments, the internal mode selection signals 653 may be the same as the external mode selection signals 605, e.g., each of the internal mode selection signals 653 indicating whether the corresponding mode circuit is selected (e.g., signal indicating value "1") or not selected (e.g., signal indicating value "0"). The selection circuitry 680 may include a plurality of AND gates 661-1, . . . , 661-P, each receiving the clock signal 652 and an internal mode selection signal 653 (corresponding to the respective mode circuit) from the control circuitry 650. For example, in response to receiving the clock signal 652 and an internal mode selection signal 653 corresponding to the mode-1 circuit and indicating selection of the mode-1 circuit (e.g., indicating value of "1"), the AND gate 661-1 may be configured to activate/enable the mode-1 circuit 670-1 such that the selected mode circuit can operate.

In response to receiving the rate of the original phase data 641 and sampled phase data 642 from the sampling circuitry 640, the selected mode circuits may be configured to operate at least one of a phase decoder (e.g., phase decoder 671-1, . . . , 671-P), one or more differentiators (e.g., differentiator 672-1, . . . , 672-P), and/or a decimator (e.g., decimator 673-1, . . . , 673-P) thereof to convert the sampled phase data 642 to one or more digital signals, and output the one or more digital signals as ADC output 607. In some embodiments, as shown in FIG. 6, the phase decoder, differentiators, and decimator can be separately implemented for different modes which can save power in low bandwidth/dynamic range modes at the cost of some extra area. Alternatively, the conversion circuitry may include a single logic block (not shown) that can be configured for different modes, which would save area at the cost of some extra power especially in low bandwidth/dynamic range modes.

In some embodiments, an analog digital converter (e.g., multi-mode ADC 600) may include an input (e.g., ADC input 601) to receive an analog signal (e.g., $V_{in}$), one or more ring oscillators (e.g., ring oscillator 620), and circuitry (e.g., control circuitry 650, sampling circuitry 640, conversion circuitry 660). In some embodiments, the one or more ring oscillators may include a plurality of rings (e.g., rings shown in FIG. 2A to FIG. 2C, rings shown in FIG. 3). The one or more ring oscillators may be configurable to operate at least based on a programmable number of coupled rings of the plurality of rings (e.g., L number of coupled rings 602). The circuitry may be coupled to the one or more ring oscillators. The circuitry may be programmable to receive a selection of a number of coupled rings (e.g., L number of coupled rings 602) and a number of phases (e.g., $N_\phi$ number of phases (or phase outputs) 603). The circuitry may be programmable to configure the one or more ring oscillators to operate at least based on the number of coupled rings. The circuitry may be programmable to cause the configured one or more ring oscillators to receive the analog signal (e.g., $V_{in}$) and output a plurality of signals (e.g., $N_\phi$ number of sampled phase data 642) having respective phases corresponding to the number of phases. The circuitry may be programmable to convert the plurality of signals to one or more digital signals (e.g., ADC output 607).

In some embodiments, the circuitry (e.g., control circuitry 650) may be configured to receive a selection of a sampling frequency (e.g., sampling frequency $f_s$ 604). The circuitry (e.g., sampling circuitry 640, conversion circuitry 660) may be configured to convert the plurality of signals (e.g., $N_\phi$ number of sampled phase data 642) to the one or more digital signals (e.g., ADC_out 607) at least based on the sampling frequency. For example, the control circuitry 650 may generate a clock signal 652 according to the sampling frequency ($f_s$) 604 and provide the clock signal 652 to the sampling circuitry 640 and the conversion circuitry 660 so that the sampling circuitry 640 and the conversion circuitry 660 operate according to the sampling frequency ($f_s$).

In some embodiments, the number of coupled rings may be an integer L that is less than or equal to an integer N. The one or more ring oscillators may include a multi-ring oscillator having N rings that are coupled to each other (e.g., coupled in a manner shown in FIG. 2A to FIG. 2C). In configuring the one or more ring oscillators, the circuitry may be configured to configure the multi-ring oscillator to operate with L coupled rings out of the N coupled rings, as the configured one or more ring oscillators. For example, in response to receiving from the control circuitry 650, the control signal 651 corresponding to L number of coupled rings, the ring oscillator 620 including N coupled rings may be configured to recouple the N rings such that only L rings out of N rings are cyclically coupled as shown in FIG. 2A to FIG. 2C.

In some embodiments, the number of coupled rings may be an integer L that is less than or equal to an integer N. The one or more ring oscillators may include N ring oscillators, each having a different number of coupled rings to each other (e.g., N ring oscillators shown in FIG. 3). In configuring the one or more ring oscillators, the circuitry may be configured to select a ring oscillator having L coupled rings, from among the N ring oscillators, as the configured one or more ring oscillators. For example, in response to receiving from the control circuitry 650, the control signal 651 corresponding to L number of coupled rings, the ring oscillator 620 including N ring oscillators (e.g., 300-1, 300-2, . . . , 300-N in FIG. 3) may be configured to select the L coupled ring oscillator (e.g., 300-L) out of the N ring oscillators.

In some embodiments, the circuitry (e.g., conversion circuitry 660) may include a plurality of circuits (e.g., mode-1 circuit 670-1, . . . , mode-P circuit 670-P) respectively configured to perform a plurality of modes (e.g., mode-1, . . . , mode-P) of analog digital converter operations. The circuitry may be configured to select one or more circuits from among the plurality of circuits. The circuitry may be configured to cause the selected one or more circuits to convert the plurality of signals to the one or more digital signals. For example, n response to receiving the rate of the original phase data 641 and sampled phase data 642 from the sampling circuitry 640, the selected mode circuits may be configured to operate at least one of a phase decoder (e.g., phase decoder 671-1, . . . , 671-P), one or more differentiators (e.g., differentiator 672-1, . . . , 672-P), and/or a decimator (e.g., decimator 673-1, . . . , 673-P) thereof to convert the sampled phase data 642 to one or more digital signals, and output the one or more digital signals as ADC output 607.

FIG. 7 is a flow diagram showing a process 700 for operating an ADC in multiple modes using one or more ring oscillators, in accordance with an embodiment. In some embodiments, the process 700 is performed by a device, circuitry, or an ADC (e.g., device 100, 400, 600). In other embodiments, the process 700 is performed by other entities. In some embodiments, the process 700 includes more, fewer, or different steps than shown in FIG. 7.

At step 702, the device (e.g., multi-mode ADC 600) may receive a selection of a number of coupled rings (e.g., L number of coupled rings 602) and a number of phases (e.g., $N_\phi$ number of phases (or phase outputs) 603).

At step 704, the device may configure one or more ring oscillators (e.g., ring oscillator 620) to operate at least based on the number of coupled rings (e.g., L number of coupled rings 602). The one or more ring oscillators may include a plurality of rings (e.g., N number of rings). In some embodiments, the number of coupled rings may be an integer L that is less than or equal to an integer N. The one or more ring oscillators may include a multi-ring oscillator having N rings that are coupled to each other (e.g., N rings may be cyclically coupled in a manner shown in FIG. 2A to FIG. 2C). In configuring the one or more ring oscillators, the circuitry may configure the multi-ring oscillator to operate with L coupled rings out of the N coupled rings, as the configured one or more ring oscillators. In some embodiments, the one or more ring oscillators may be N ring oscillators, each having a different number of coupled rings to each other. For example, in response to receiving from the control circuitry 650, the control signal 651 corresponding to L number of coupled rings, the ring oscillator 620 including N coupled rings may be configured to recouple the N rings such that only L rings out of N rings are cyclically coupled as shown in FIG. 2A to FIG. 2C.

In some embodiments, in configuring the one or more ring oscillators, the circuitry may select a ring oscillator having L coupled rings, from among the N ring oscillators, as the configured one or more ring oscillators. For example, in response to receiving from the control circuitry 650, the control signal 651 corresponding to L number of coupled rings, the ring oscillator 620 including N ring oscillators (e.g., 300-1, 300-2, . . . , 300-N in FIG. 3) may be configured to select the L coupled ring oscillator (e.g., 300-L) out of the N ring oscillators.

At step 706, the device may cause the configured one or more ring oscillators to receive an input signal (e.g., $V_{in}$ as ADC input 601), and output a plurality of signals (e.g., $N_\phi$ number of phase outputs 621) having respective phases corresponding to the number of phases (e.g., $\phi<N_\phi-1:0>$). In some embodiments, the input signal may be an analog voltage signal, an analog current signal, radio waves, sound waves, or any signal or physical quantity that continuously and infinitely varies in accordance with some time-varying parameter. In some embodiments, the output signals from the ring oscillators may be a plurality of signals that have periodic waveforms (e.g., sine waveform, square waveform).

At step 708, the device may convert the plurality of signals (e.g., $N_\phi$ number of phase outputs 621, or $N_\phi$ number of sampled phase data 642) to one or more digital signals (e.g., ADC_out 607). In some embodiments, the one or more digital signals may include digital voltage signals, digital current signals, or any signals that represent a sequence of discrete values. In some embodiments, the circuitry may receive a selection of a sampling frequency (e.g. sampling frequency $f_s$ 604). The circuitry (e.g., sampling circuitry 640, conversion circuitry 660) may convert the plurality of signals (e.g., $N_\phi$ number of sampled phase data 642) to the one or more digital signals (e.g., ADC_out 607) at least based on the sampling frequency. For example, the control circuitry 650 may generate a clock signal 652 according to the sampling frequency ($f_s$) 604 and provide the clock signal 652 to the sampling circuitry 640 and the conversion circuitry 660 so that the sampling circuitry 640 and the conversion circuitry 660 operate according to the sampling frequency ($f_s$).

In some embodiments, the circuitry (e.g., conversion circuitry 660) may include a plurality of circuits (e.g., mode-1 circuit 670-1, . . . , mode-P circuit 670-P) respectively configured to perform a plurality of modes (e.g., mode-1, . . . , mode-P) of analog digital converter operations. The circuitry may select one or more circuits from among the plurality of circuits. The circuitry may cause the selected one or more circuits to convert the plurality of signals to the one or more digital signals. For example, n response to receiving the rate of the original phase data 641 and sampled phase data 642 from the sampling circuitry 640, the selected mode circuits may be configured to operate at least one of a phase decoder (e.g., phase decoder 671-1, . . . , 671-P), one or more differentiators (e.g., differentiator 672-1, . . . , 672-P), and/or a decimator (e.g., decimator 673-1, . . . , 673-P) thereof to convert the sampled phase data 642 to one or more digital signals, and output the one or more digital signals as ADC output 607.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code. In some embodiments, the ADC is employed as an integrated circuit in a transmitter for wireless communication. The ADC is provided on an integrated circuit that includes the calibration engine. The ADC and calibration engine are provided in a single chip or multichip integrated package in some embodiments.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above-described embodiments, methods, and examples, but by all embodiments and methods within the scope and spirit of the disclosure.

What is claimed is:

1. A device comprising:
   one or more ring oscillators comprising a plurality of rings; and
   circuitry configured to:
     receive a control signal corresponding to a number of coupled rings and a number of phases;
     configure, based at least on the control signal, the one or more ring oscillators to operate using one or more coupled rings corresponding to the number of coupled rings;
     cause the configured one or more ring oscillators to receive an input signal and output a plurality of signals having respective phases corresponding to the number of phases; and
     convert the plurality of signals to one or more digital signals.

2. The device of claim 1, wherein
   the control signal further corresponds to a sampling frequency, and
   the circuitry is configured to:
     convert, based at least on the control signal, the plurality of signals to the one or more digital signals using the sampling frequency.

3. The device of claim 1, wherein
   the number of coupled rings is an integer L that is less than or equal to an integer N,
   the one or more ring oscillators comprises a multi-ring oscillator having N rings that are coupled to each other, and
   in configuring the one or more ring oscillators, the circuitry is configured to configure the multi-ring oscillator to operate with L coupled rings out of the N coupled rings, as the configured one or more ring oscillators.

4. The device of claim 1, wherein
   the number of coupled rings is an integer L that is less than or equal to an integer N,
   the one or more ring oscillators comprises N ring oscillators, each having a different number of coupled rings to each other, and
   in configuring the one or more ring oscillators, the circuitry is configured to select a ring oscillator having L coupled rings, from among the N ring oscillators, as the configured one or more ring oscillators.

5. The device of claim 1, wherein
   the circuitry comprises a plurality of circuits respectively configured to perform a plurality of modes of analog digital converter operations.

6. The device of claim 5, wherein the circuitry is configured to:
   select one or more circuits from among the plurality of circuits, and
   cause the selected one or more circuits to convert the plurality of signals to the one or more digital signals.

7. An analog digital converter comprising:
   an input to receive an analog signal;
   one or more ring oscillators comprising a plurality of rings and configurable to operate at least based on a programmable number of coupled rings of the plurality of rings; and
   circuitry coupled to the one or more ring oscillators, wherein the circuitry is programmable to:
     receive a selection of a number of coupled rings and a number of phases;
     configure the one or more ring oscillators to operate at least based on the number of coupled rings;
     cause the configured one or more ring oscillators to receive the analog signal and output a plurality of signals having respective phases corresponding to the number of phases; and
     convert the plurality of signals to one or more digital signals.

8. The analog digital converter of claim 7, wherein the circuitry is configured to:
   receive a selection of a sampling frequency; and
   convert the plurality of signals to the one or more digital signals at least based on the sampling frequency.

9. The analog digital converter of claim 7, wherein
   the number of coupled rings is an integer L that is less than or equal to an integer N,
   the one or more ring oscillators comprises a multi-ring oscillator having N rings that are coupled to each other, and
   in configuring the one or more ring oscillators, the circuitry is configured to configure the multi-ring oscillator to operate with L coupled rings out of the N coupled rings, as the configured one or more ring oscillators.

10. The analog digital converter of claim 7, wherein
    the number of coupled rings is an integer L that is less than or equal to an integer N, the one or more ring oscillators comprises N ring oscillators, each having a different number of coupled rings to each other, and in configuring the one or more ring oscillators, the circuitry is configured to select a ring oscillator having L coupled rings, from among the N ring oscillators, as the configured one or more ring oscillators.

11. The analog digital converter of claim 7, wherein the circuitry comprises a plurality of circuits respectively configured to perform a plurality of modes of analog digital converter operations.

12. The analog digital converter of claim 11, wherein the circuitry is configured to:
select one or more circuits from among the plurality of circuits, and
cause the selected one or more circuits to convert the plurality of signals to the one or more digital signals.

13. A device comprising:
one or more ring oscillators configured to receive an input signal and output a plurality of signals; and
circuitry configured to convert the plurality of signals from the one or more ring oscillators to one or more digital signals, wherein
the one or more ring oscillators comprises a multi-ring oscillator having first-to-$N^{th}$ rings, each ring comprising first-to-$M^{th}$ differential amplifiers, wherein N and M are integers greater than 1 and each differential amplifier has a first input and a first output that have a first polarity, and a second input and a second output that have a second polarity, and
the first to $N^{th}$ rings are cyclically coupled such that the second output of the $M^{th}$ differential amplifier of the $N^{th}$ ring is coupled to the first output of the first differential amplifier of the first ring.

14. The device of claim 13, wherein the first to $N^{th}$ rings are cyclically coupled such that the second input of the $M^{th}$ differential amplifier of the $N^{th}$ ring is coupled to the second output of the $M^{th}$ differential amplifier of the first ring.

15. The device of claim 13, wherein in each ring,
the first output and the second output of the $i^{th}$ differential amplifier are coupled to the first input and the second input of the $(i+1)^{th}$ differential amplifier, respectively, wherein i is an integer that is greater than or equal to 1 and less than M, and the first output and the second output of the $M^{th}$ differential amplifier are coupled to the second input and the first input of the first differential amplifier, respectively.

16. The device of claim 13, wherein
the first outputs of the $i^{th}$ differential amplifiers of the N rings are coupled to each other, wherein i is an integer that is greater than or equal to 1 and less than or equal to M, and
the second outputs of the $i^{th}$ differential amplifiers of the N rings are coupled to each other.

17. The device of claim 13, wherein the circuitry is configured to:
receive a selection of a number of coupled rings and a number of phases;
configure the multi-ring oscillator to operate at least based on the number of coupled rings;
cause the configured multi-ring oscillator to output the plurality of signals having respective phases corresponding to the number of phases; and
convert the plurality of signals from the configured multi-ring oscillator to one or more digital signals.

18. The device of claim 17, wherein the circuitry is configured to:
receive a selection of a sampling frequency; and
convert the plurality of signals from the configured multi-ring oscillator to the one or more digital signals at least based on the sampling frequency.

19. The device of claim 17, wherein
the number of coupled rings is an integer L that is less than or equal to N, and
in configuring the one or more ring oscillators, the circuitry is configured to configure the multi-ring oscillator to operate with L coupled rings out of the N coupled rings, as the configured one or more ring oscillators.

20. The device of claim 13, wherein
the circuitry comprises a plurality of circuits respectively configured to perform a plurality of modes of analog digital converter operations, and
the circuitry is configured to:
select one or more circuits from among the plurality of circuits, and
cause the selected one or more circuits to convert the plurality of signals to the one or more digital signals.

* * * * *